United States Patent [19]

Fukuda

[11] 4,040,015
[45] Aug. 2, 1977

[54] COMPLEMENTARY MOS LOGIC CIRCUIT
[75] Inventor: Hideki Fukuda, Mitaka, Japan
[73] Assignee: Hitachi, Ltd., Japan
[21] Appl. No.: 698,517
[22] Filed: June 22, 1976

Related U.S. Application Data

[62] Division of Ser. No. 511,277, Oct. 2, 1974.

[30] Foreign Application Priority Data

Apr. 16, 1974 United Kingdom ............... 16641/74

[51] Int. Cl.² ............................................. G11C 11/40
[52] U.S. Cl. ................................. 340/173 R; 307/238
[58] Field of Search ................. 340/173 R; 307/238, 307/279

[56] References Cited

U.S. PATENT DOCUMENTS

| | | | |
|---|---|---|---|
| 3,497,715 | 2/1970 | Yen | 307/205 |
| 3,551,693 | 12/1970 | Burns | 307/205 |
| 3,601,627 | 8/1971 | Bouher | 307/205 |
| 3,829,710 | 8/1974 | Hirasawa | 307/205 |
| 3,852,625 | 12/1974 | Kubo | 307/304 |

Primary Examiner—Terrell W. Fears
Attorney, Agent, or Firm—Craig & Antonelli

[57] ABSTRACT

A dynamic complementary metal-oxide-semiconductor circuit (CMOS) includes a pair of gate stages connected in cascade. The first gate stage includes a first logic block which effects a prescribed logical function, the logic block being connected between a P-type and the N-type MOSFET. The source electrodes of the P-type and the N-type MOSFETs are connected between a power supply and ground, respectively, and their gate electrodes are connected in common. Moreover, the first gate stage has its output terminal connected to a load capacitor.

The second logic block is also connected between a P-type MOSFET and an N-type MOSFET. The source electrodes of these MOSFETs are connected between a power supply and ground, respectively, while the gate electrodes thereof are connected in common. Also, a second load capacitor is connected to the output of the second gate stage.

A pair of pulse signals, inverted with respect to each other, are applied to the first and second gate stages for driving the same, respectively. One of the MOSFETs making up the second logic block is of the type and is connected so that, when the power supply voltage applied to the gate thereof from the first gate stage, that MOSFET is turned "off". As a result, the possibility of misoperation due to the decrease in the charge of the first load capacitor, at the output of the first gate stage, is prevented.

2 Claims, 12 Drawing Figures

COMPLEMENTARY MOS LOGIC CIRCUIT

This is a division of application Ser. No. 511,277, filed Oct. 2, 1974.

BACKGROUND OF THE INVENTION

1. Field of the Invention

The present invention relates to complementary MOS logic circuits and, in particular, cascaded stages of dynamic complementary MOS circuits. In the present specification the abbreviation MOS is to mean both metal-oxide-semiconductor or MIS (metal-insulator-semiconductor) devices.

2. Description of the Prior Art

Because of its low power consumption and the stability of its output voltage, the complementary MOS (CMOS) logic circuit is particularly advantageous for use in present day electronic circuitry.

Typically CMOS logic circuits may be classified into two types, static and dynamic.

The first type, i.e. the sttic type of circuit, is described, for example, in the U.S. Pat. No. 3,356,858 to Wanlass, issued Dec. 5, 1967. An illustration of an exemplary circuit described therein is shown in FIG. 1 of the drawings of the present application, wherein P-type MOSFETs 10-12 and N-type MOSFETs 20-22 are depicted. The N-type MOSFETs 20-22 are connected in series, while the P-type MOSFETs 10-12 are connected in parallel. The gate electrodes of the N-type driver MOSFETs 10-12 are connected with the corresponding electrodes of the P-type MOSFETs 20-22, respectively. This static type of CMOS logic circuit requires a relatively large number of transistors, since a pair of MOSFETs, i.e. a P-type and an N-type MOSFET, are required for each input A, B, and C.

As an example of a dynamic type of logic circuit, reference may be had to the U.S. Pat. No. 3,551,693 to Burns et al., an example of the circuitry disclosed in which being shown in FIG. 2 of the drawings of the present application. In FIG. 2, a P-type MOSFET 10 and N-type MOSFETs 20-22 and 30 are depicted. The series connected N-type MOSFETs 20-22 make up a logic block (LB) shown in broken lines and are connected between the drain electrode of the P-type MOSFET 10 and the drain electrode of the N-type MOSFET 30. The gate electrode of the P-type MOSFET 10 is connected with the gate electrode of the n-type MOSFET 30 and a pulse signal $\phi$ is supplied to the commonly connected gate electrodes. The output from the circuit is taken from the common connection between the P-type MOSFET 10 and the N-type MOSFET 20.

A comparison of the dynamic type of circuit shown in FIG. 2 with the static type of circuit shown in FIG. 1, discussed above, will reveal that the number of transistors employed in the dynamic type of circuit can be reduced, since the number of load MOSFETs is decreased. As a result, the dynamic type of MOSFET can be more readily integrated into a semiconductor substrate.

However, this type of dynamic circuit is not without its own problems. Namely, when the circuit shown in FIG. 2 is connected in a cascade arrangement, the possibility of the circuit operating incorrectly exists. For a better understanding of this problem, attention is directed to FIGS. 3 and 4 of the drawings. FIG. 3 illustrates a cascade connection of the circuit shown in FIG. 2 and FIG. 4 illustrates voltage waveforms which exist at various portions of the circuit.

In FIG. 3, for purposes of simplification, the logic block LB of FIG. 2 is represented by a single MOSFET 20a or 20b, and the first and second gate stages are driven by the same pulse signal $\phi$.

In addition to the standard load capacitors $CL_1$ and $CL_2$ shown connected at the output of each respective gate stage, there are additional capacitors $C_1$ and $C_2$, the capacitors including both junction capacitances, gate capacitances and wiring capacitances. Furthermore, when the MOSFETs are turned on, they have channel resistances of several hundred ohms.

Now, with attention directed to FIG. 4, when a pulse signal $\phi$ which varies between the power supply voltage of $+V_{DD}$ and 0 volts, is switched from the high voltage ($+V_{DD}$) to 0 volts, the P-type MOSFET 10a will be turned on, while the N-type MOSFET 30a will be turned off. As a result, capacitor $CL_1$ is charged at a voltage $+V_{DD}$ through the MOSFET 10a. The period of time $t_1$ as shown in FIG. 4 will be referred to as the "percharge period". The percharge period $t_1$ should be so selected as to assure that the capacitor $CL_1$ will be sufficiently charged so that a voltage of $+V_{DD}$ will be maintained thereacross, when considering the time constant determined by the capacitor $CL_1$ and the channel resistance of MOSFET 10a.

Now, when the pulse signal $\phi$ switches back to the high potential ($+V_{DD}$) the P-type MOSFET 10a will be turned off, while the N-type MOSFET 30a will be turned on. During this condition, if a voltage of $+V_{DD}$ is applied to the INPUT terminal, then MOSFET 20a will be turned on and the charge which has been stored in capacitor $CL_1$ will be discharged through the series connection of MOSFETs 20a and 30a to ground. During this charging operation, the potential at the point X (the output of the first gate stage) will decrease exponentially to a level of 0 volts (ground potential) from its high voltage level of $+V_{DD}$, as shown by the curve portion $a$ in FIG. 4, the time constant of the exponential decrease of the potential at point X being determined by the capacitor $CL_1$ and the channel resistance of MOSFETs 20a and 30a.

With the gates of MOSFETs 10b and 30b also being supplied with a pulse signal $\phi$, then, when the pulse signal $\phi$ is at a level of 0 volts, as shown in FIG. 4, P-type MOSFET 10b will be turned on, while N-type MOSFET 30b will be turned off, so that the second load capacitor $CL_2$ will be charged at a voltage of $+V_{DD}$ through MOSFET 10b.

When the pulse signal $\phi$ changes to the high level ($+V_{DD}$) P-type MOSFET 10a will be turned off, while N-type MOSFET 30a will be turned on. During the period of time immediately after MOSFET 10b is turned off, the voltage at the point Y at the output of the second gate stage should be at the high level ($+V_{DD}$), since MOSFETs 20a and 30a are turned on during this period.

However, since the voltage at the point X decreases exponentially to a level of zero volts (ground potential), as discussed above, from its initial high level of $+V_{DD}$, MOSFET 20b will remain turned on until the voltage level at the point X becomes lower than the threshold voltage of MOSFET 20b.

As a result, the charge stored in capacitor $CL_2$ partially discharges through MOSFETS 20b and 30b to ground, so that the voltage level at the point Y does not remain at the high level of $+V_{DD}$ as intended, but drops to a lower voltage level, as shown by curve $b$ in FIG. 4.

Because the voltage level b is lower than the threshold voltage of a MOSFET in the next subsequent cascaded stage connected to the output terminal Y, such a MOSFET will not be turned off, so that the operation of the circuit is defective.

SUMMARY OF THE INVENTION

In accordance with the invention, the above described improper discharge operation is eliminated in a complementary MOS integrated circuit. For this purpose, in the second gate stage, a P-type MOSFET is employed, which MOSFET is turned off when the high level voltage ($+V_{DD}$) is applied to its gate electrode. The gate electrodes of a complementary pair of opposite conductivity type MOSFETs receive a pulse voltage, which is inverted with respect to the pulse voltage applied to the first gate stage and the output is taken from the common connection point of opposite conductivity type MOSFETs in the second stage.

DETAILED DESCRIPTION OF THE INVENTION

Figure 1:
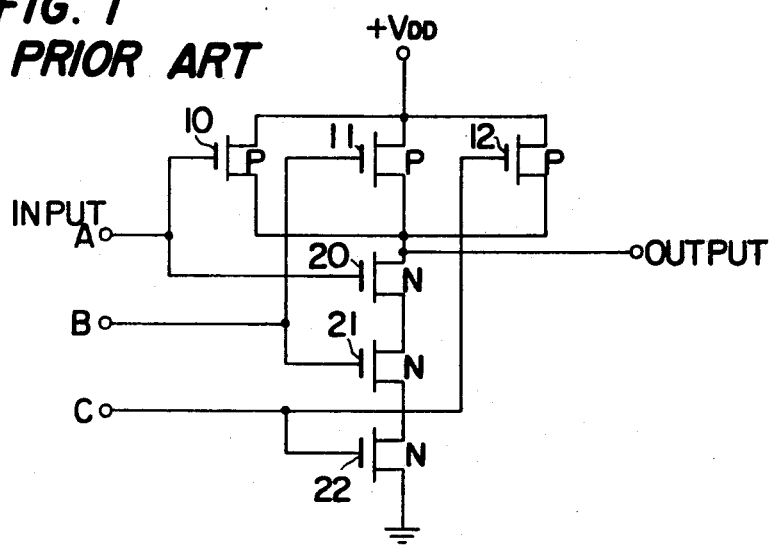
FIG. 1 is a schematic illustration of a prior art type of static complementary MOS logic circuit.
Figure 2:
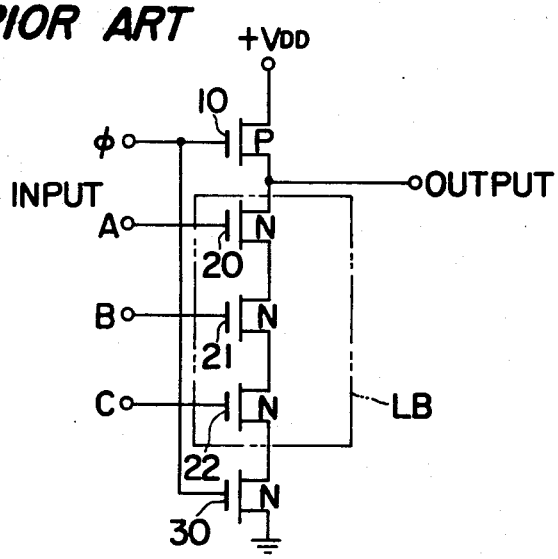
FIG. 2 is a schematic illustration of a prior art type of dynamic complementary MOS logic circuit.
Figure 3:
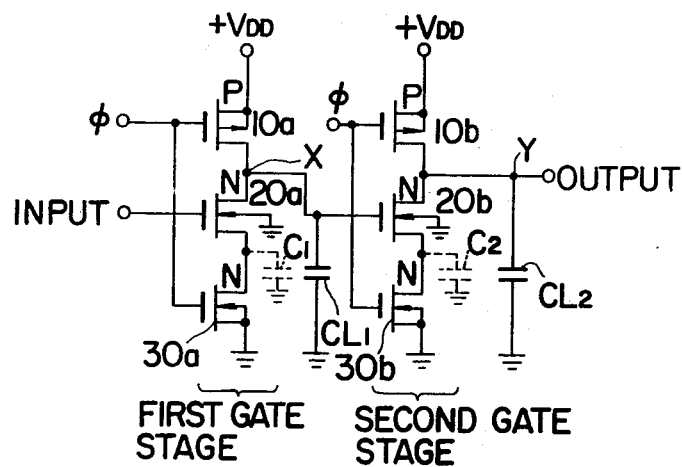
FIG. 3 depicts a cascaded connection of a pair of dynamic complementary MOS logic circuits of the type shown in FIG. 2.
Figure 5:
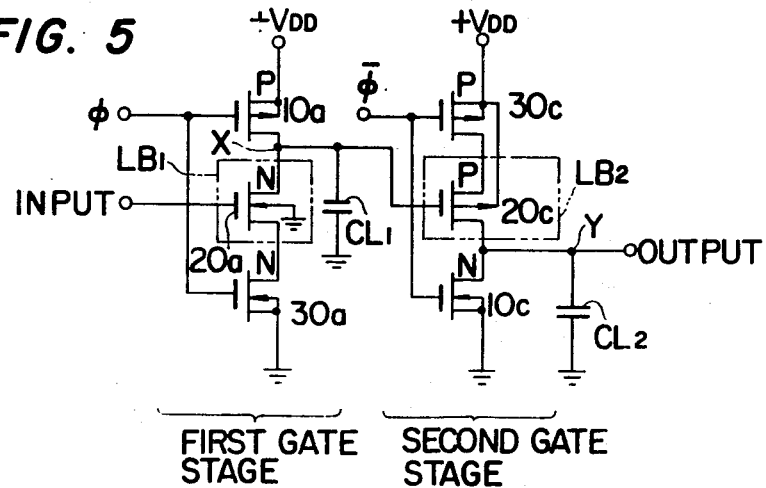
FIG. 5 is a schematic illustration of a complementary MOS logic circuit in accordance with an embodiment of the invention.

A basic complementary MOS logic circuit of the present invention is depicted in FIG. 5. In the figure, a first gate stage and a second gate stage are depicted with the output of the first stage being connected in cascade to the inut of the second stage. Each stage includes a logic block, the first stage logic block, the first stage logic block being shown, for the purposes of simplifying the illustration, as made up of a single transistor 20a, which is surrounded by broken lines $LB_1$ connected to driver transistors 10a and 30a, which have P and N conductivity types, respectively. The second stage, in addition to driver transistors 30c and 10c, which are of N-type and P-type conductivities, respectively, includes a transistor 20c, which is surrounded by broken lines $LB_2$. A significant difference between the cascaded arrangement shown in FIG. 3 and that of the present invention depicted in FIG. 5 is the type of transistor making up the logic block $LB_2$, the point of the output connection Y, and the polarities of the gating pulses.

To the output Y is also connected an output capacitor $CL_2$ and the gate electrode of the driver transistors 30c and 10c are connected to receive a pulse signal $\bar{\phi}$.

Figure 6:
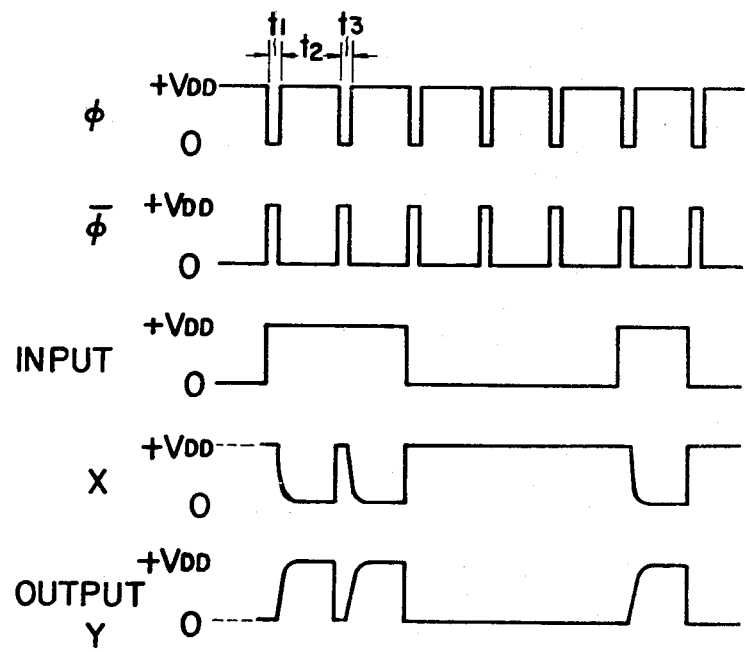
FIG. 6 depicts voltage waveforms for various points of the complementary logic circuit shown in FIG. 5.

For the respective first and second gate stages, shown in FIG. 5, the clock pulse signals $\phi_1$ and $\bar{\phi}_1$ are inverted with respect to one another, i.e. they are at opposite high and zero levels, as shown in FIG. 6.

For a better understanding of the improvement provided by the present invention, its operation will now be discussed, with attention directed to both FIGS. 5 and 6.

Initially, during the precharge period $t_1$, when clock signal $\phi$ has dropped to the lower voltage level (zero volts), MOSFET 10a will be turned on and MOSFET 30a will be turned off, so that the high voltage level ($+V_{DD}$) will be applied to capacitor $CL_1$ through MOSFET 10a, irrespective of the level of the input signal applied to the terminal INPUT.

With respect to the second gate stage, however, with an inverted polarity pulse signal $\bar{\phi}$ being applied to the driver transistors 30c and 10c, MOSFET 30c will be turned off, while MOSFET 10c will be turned on. During this period of time, a voltage level of zero volts will be applied to the capacitor $CL_2$ through MOSFET 10c. Namely, the connection point Y will be substantially grounded through MOSFET 10c.

Now, when the voltage level of the clock pulse signal $\phi$ returns to the high level ($+V_{DD}$) and a voltage level of $+V_{DD}$ is applied to the terminal INPUT, as shown in FIG. 6, MOSFET 20a will be turned on, MOSFET 10a will be turned off, and MOSFET 30a will be turned on. As a result, the charge which has been stored on capacitor $CL_1$ will discharge to ground through MOSFETs 20a and 30a, so that the output signal appearing at point X will drop to the lower voltage level of zero volts, again as shown in FIG. 6.

Since capacitor $CL_1$ has discharged, a voltage of substantially zero volts will be applied to the gate electrode of transistor 20c, making up logic block $LB_2$ in the second gate stage. Accordingly, MOSFET 20c will be turned on. During the period of time $t_2$, with MOSFET 20c turned on, because of the level of the inverted pulse signal $\bar{\phi}$, N-type MOSFET 10c will be turned off, while MOSFET 30c will be turned on. Since both MOSFETs 30c and 20c are turned on and there is substantially an open circuit between the output Y and ground (transistor 10c is turned off) current will flow from the power supply terminal $+V_{DD}$ through transistors 30c and 20c to charge capacitor $CL_2$ at the high voltage level ($+V_{DD}$). Therefore, the voltage at the point Y, OUTPUT terminal, is at the voltage level of $+V_{DD}$ volts.

Next, during the precharge period $t_3$ immediately subsequent to period $t_2$, the polarities of the clock signals $\phi$ and $\bar{\phi}$ are reversed. As a result, transistor 30a is again turned off and transistor 10a is again turned on. Since transistor 10a is turned on, capacitor $CL_1$ will again charge to the high voltage level $+V_{DD}$. On the other hand, during the same period of time $t_3$, transistor 30c will be turned off while transistor 10c will be turned on, thereby enabling capacitor $CL_2$ to discharge through transistor 10c.

In other words, as long as the potential applied to the INPUT is at a high level of $+V_{DD}$ volts, potentials at the outputs X and Y will substantially follow the clock pulse signals φ and $\bar{\phi}$, but being inverted with respect thereto, respectively.

Now, when the voltage applied to the INPUT terminal drops to the low level of zero volts, transistor 20a will be turned off, thereby blocking any discharge path for capacitor $CL_1$, so that the potential at point X will remain at the high voltage level of $+V_{DD}$ once capacitor $CL_1$ has been charged through transistor 10a.

Similarly, since the voltage across capacitor $CL_1$ is maintained at a high potential, the P-type MOSFET 20c will be turned off, thereby preventing a charge path from being established from the power supply terminal $+V_{DD}$ through transistors 30c and 20c to capacitor $CL_2$. As a result, once capacitor $CL_2$ discharges through transistor 10c when the latter is turned on, it will remain discharged until the potential at the INPUT terminal changes. These voltage potentials are depicted in FIG. 6c, with the voltages at points X and Y being respectively permanently high and low during the period of time that the voltage applied to the terminal INPUT is low.

Figure 4:
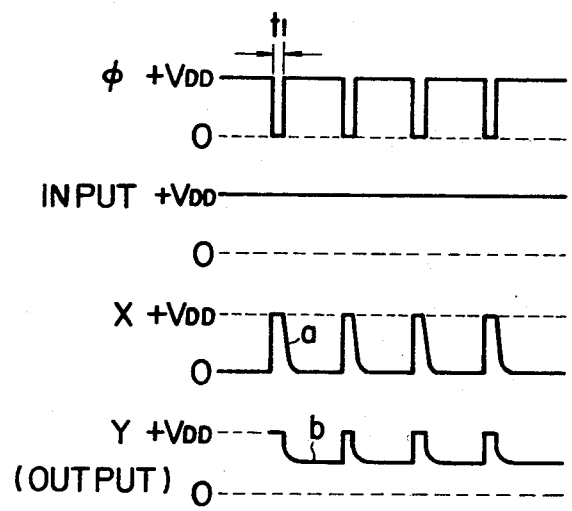
FIG. 4 shows voltage waveforms in various portions of the circuit of FIG. 3 during the operation thereof.

Thus, due to the charge stored on the capacitor $CL_1$, MOSFET 20c in the second gate stage is maintained non-conductive during the period of time when an output is derived at the OUTPUT terminal, with MOSFET 20a being turned on. When the charge storing capacitor $CL_1$ discharges through the series connection of MOSFETS 20a and 30a, within the first gate stage, the MOSFET 20c in the second gate stage will be turned on, so that the voltage level $+V_{DD}$ will be applied to the capacitor $CL_2$ through MOSFETs 30c and 10c. As a result, a decrease in the output voltage, as shown in curve b in FIG. 4 discussed previously, is avoided.

Moreover, since the complementary MOS circuitry of this invention forms a dynamic circuit, a smaller number of circuit elements can be used, so that the power consumption is reduced.

Furthermore, for the clock pulse signals applied to the driving transistors, a simple signal arrangement may be provided, since the signals applied to the second stage are merely the inverse of those applied to the first stage. This further decreases the complexity of the circuitry for driving the respective stages and since the phase of the signals φ and $\bar{\phi}$ is the same a high switching speed can be obtained.

Figure 7:
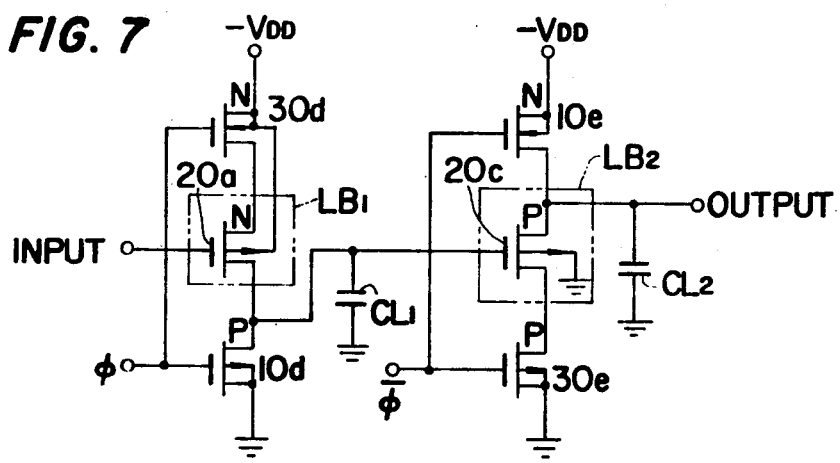
FIG. 7 is a modification of the circuit shown in FIG. 5, with the polarities of the driver transistors and power supply voltages appropriately reversed.
Figure 8:
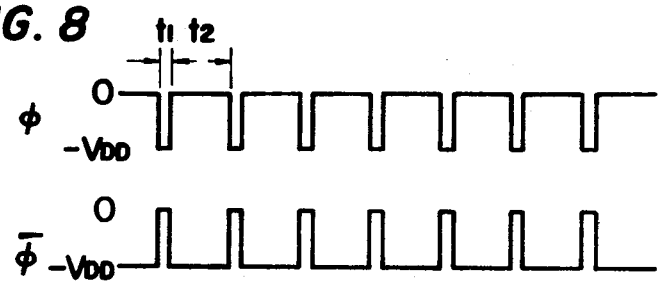
FIG. 8 illustrates the pulse signal waveforms applied to the gate electrodes of the driver transistors illustrated in FIG. 7.

In a modification of the embodiment of the invention depicted in FIG. 5, the conductivity types of the transistors may be reversed. Namely, as shown in FIG. 7, driving transistors 30d, 10d and 10e, 30e, in the first and second stages have their conductivity types reversed and the polarity of the voltage $V_{DD}$ is reversed to a negative one. In this case, the polarities of the clock signals φ and $\bar{\phi}$ are reversed with respect to that shown in FIG. 6, namely, the voltage varies between a level of zero volts and $-V_{DD}$ volts as shown in FIG. 8.

Figure 9:
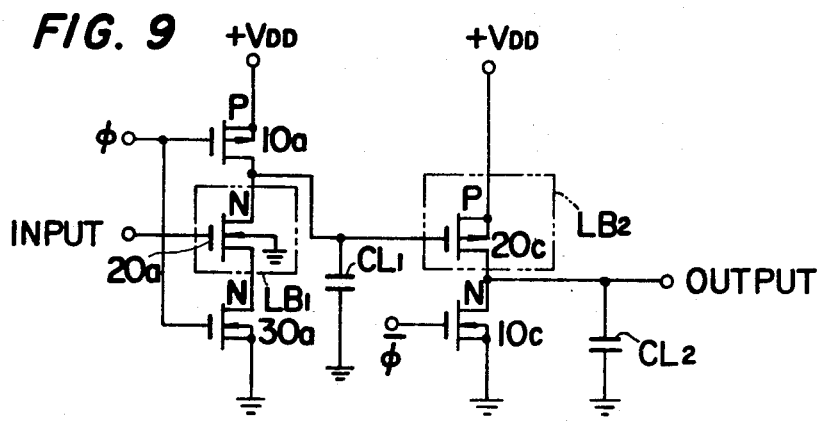
FIG. 9 depicts a further modification of the complementary logic circuit shown in FIG. 5.

In a further embodiment of the invention, as depicted in FIG. 9, the MOSFET 10c, connected between the power supply terminal $+V_{DD}$ and the logic block $LB_2$, may be omitted, since MOSFET 20c of the logic block $LB_2$ is also turned off during the precharge period.

Figure 10:
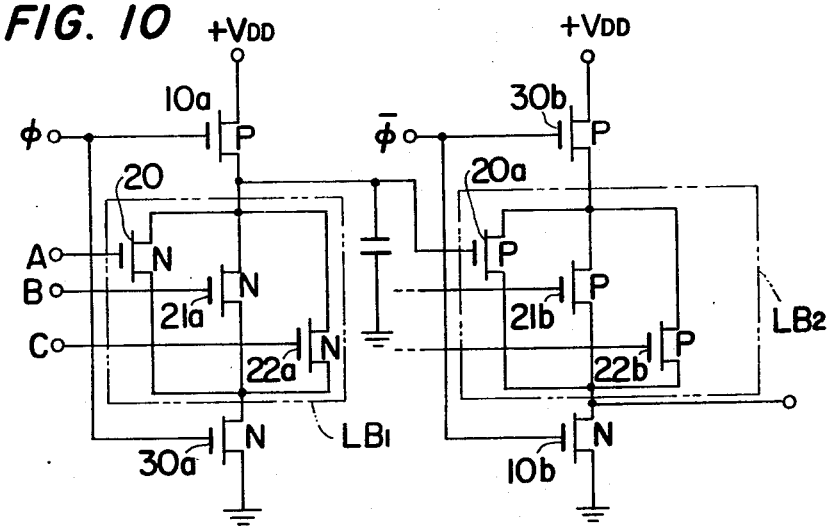
FIG. 10 depicts a NOR logic gate circuit employing the complementary MOS circuitry of the present invention.

FIG. 10 depicts a practical embodiment of the invention of a NOR logic gate circuit, with each of the logic blocks $LB_1$, $LB_2$ made up of a plurality of transistors to which respective inputs A, B and C are applied. The conductivity type of each of the transistors in the second logic block $LB_2$ is of the same type as that connected to the power supply terminal $+V_{DD}$, i.e. transistor $M_{30b}$, as is the case with transistor 20c shown in FIG. 5. The gate inputs to transistors $M_{21b}$ and $M_{22b}$ are connectable to the other logic signal inputs similar to the inputs B and C for $LB_1$.

The invention is also applicable to the formation of other types of logic circuitry, such as AND gates, NAND gates, OR gates, and READ-ONLY MEMORIES.

Figure 11:
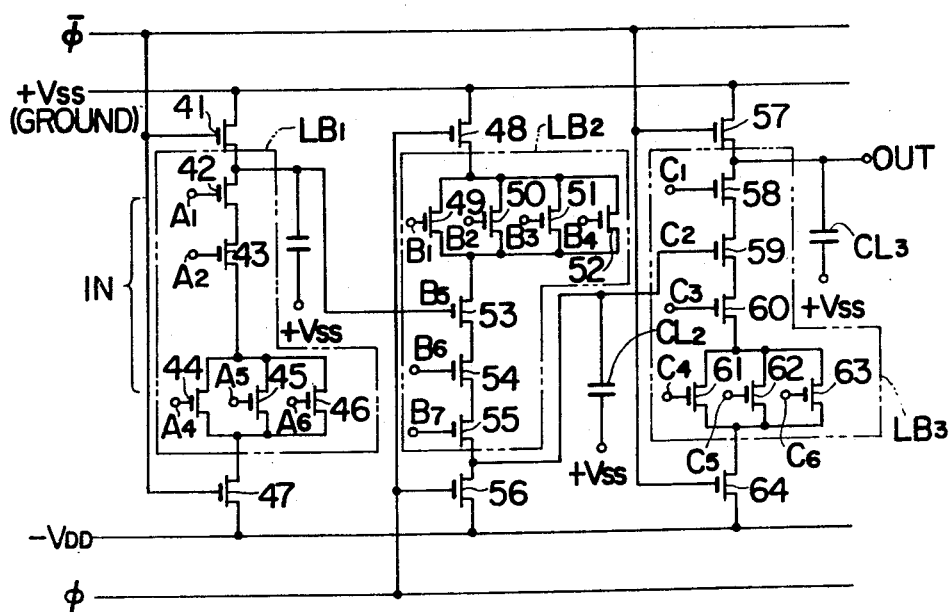
FIGS. 11 and 12 depict a read only memory employing the circuitry of the present invention.
Figure 12:
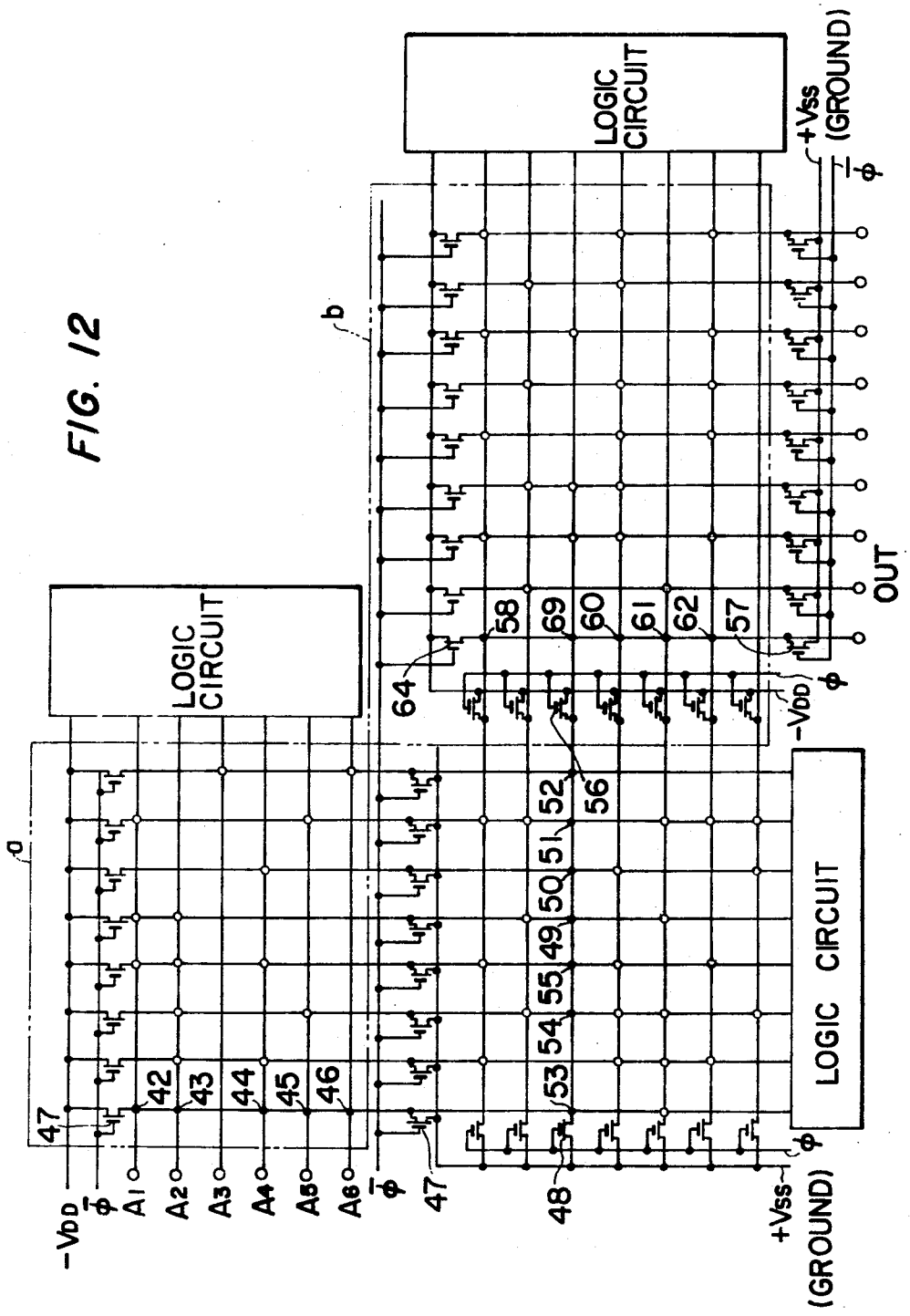

A read-only memory (ROM) employing gate circuits according to this invention is shown in FIGS. 11 and 12.

In FIG. 11, a first stage gate circuit is constituted by p channel MOSFET 41, n channel MOSFET 47 and a first logic block LB1 made up of a plurality of n channel MOSFETs 42, 43, 44, 45, and 46. The first logic block LB1 effects the following logic function:

$$LB1 =: A1 . A2 . (A4 + A5 + A6)$$

The first block LB1 is connected between the pair of complementary MOSFETs 41 and 47, the gate electrodes of which are supplied with an inverted pulse signal $\bar{\phi}$.

A second stage gate circuit is constituted by N channel MOSFET 48, p channel MOSFET 56 and a second logic block LB2 made up of a plurality of p channel MOSFETs 49, 50, 51, 52, 53, 54, and 55. The second logic LB2 effects the following logic function:

$$LB2 = (B1 . B2 . B3 . B4) + B5 + B6 + B7$$

The second logic block LB2 is connected between the pair of complementary MOSFETs 48 and 56, the gate electrodes of which are supplied with a pulse signal φ.

A third stage gate circuit is constituted by p channel MOSFET 57, n channel MOSFET 64 and a third logic block LB2 made up of a plurality of N channel MOSFETs 58, 59, 60, 61, 62 and 63. The third logic block LB3 effects the following function:

$$LB3 = C1 . C2 . C3 (C4 + C5 + C6)$$

The third logic block LB3 is connected between the pair of complementary MOSFETs 57 and 64, the gate electrodes of which are supplied with the inverted pulse signal $\bar{\phi}$.

The source electrodes of the p type MOSFETs 41 and 57 and n type MOSFET 48 are connected to a voltage source + Vss (ground), respectively. The drain electrodes of the n type MOSFETs 47 and 64 and p type MOSFET 50 are connected to another voltage source − VDD, respectively.

The gate electrodes of the MOSFETs 49, 50-52, 54, 55, 58, 60-62, and 63 are connected to other logic circuits which are not shown in FIG. 11.

A layout of an integrated circuit of a ROM is shown in FIG. 12.

In FIG. 12, the black points represent MOSFETs in the logic block which are shown in FIG. 11. The hollow circles represent MOSFETs in other logic blocks which are not shown in FIG. 11.

N type MOSFETs are arranged at prescribed locations as shown by broken lines a and b in FIG. 12. Similarly, P type MOSFETs are also arranged at prescribed locations. In an actual IC, for example, P type MOSFETs may be formed in certain positions of n type semiconductor substrate, while n type MOSFETs may be formed in p type well regions which are formed in the n type semiconductor substrate.

Now, when the inverted pulse signal $\bar{\phi}$ switches to the low potential (−VDD), the p type MOSFETs 41 and 57 will be turned on, and the n type MOSFETs 47 and 64 will be turned off. As a result, capacitors CL1 and CL3 are discharged through MOSFETs 41 and 57 to + Vss (Ground), respectively and p type MOSFET 53 remains turned off. At the same time, the pulse signal $\phi$ switches to the high potential (+Vss zero volt), the p type MOSFET 56 will be turned on, while the n type MOSFET 48 will be turned off. As a result, capacitor CL2 is charged to the voltage VDD through MOSFET 56, and n type MOSFET 59 remains turned off.

Next, when the inverted pulse signal $\bar{\phi}$ switches back to the high potential (+Vss), the p type MOSFETs 41 and 57 will be turned off, while the n type MOSFETs 47 and 64 will be turned on. During the pulse signal $\phi$ at +Vss, if a voltage +Vss is applied to the input terminals A1, A2 and at least one of A4, A5 and A6, MOSFETs 42, 43, and at least one of 44, 45 and 46 will be turned on and capacitor CL1 will be charged to − VDD volts through the series connection of MOSFETs 42 and 43 and the parallel connection of MOSFETs 44, 45 and 46 and MOSFET 47. Therefore, MOSFET 53 will be turned on, and, if a voltage − VDD is applied to the other input terminals B6 and B7 and at least one of B1–B4, then MOSFETs 54, 55 and at least one of 49–52 will be turned on, the charge which is stored in capacitor CL2 will be discharged through the series connection of MOSFETs 53, 54 and 55 and the parallel connection of MOSFETs 49, 50, 51 and 52 and MOSFET 48 to ground. Therefore, MOSFET 59 will also be turned on, and, if a voltage +Vss is applied to the other input terminals C1, C3 and at least one of C4, C5 and C6, MOSFETs 58, 60 and at least one of 61, 62 and 63 will be turned on and the capacitor CL3 will be charged to − VDD volts through the series connection of MOSFETs 58, 59 and 60 and the parallel connection of MOSFETs 61, 12 and 63 and MOSFET 64. Therefore, the voltage at the output OUT reaches the low level (−VDD).

While I have shown and described several embodiments in accordance with the present invention, it is understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

I claim:

1. A read-only memory comprising
a first gate stage matrix formed of m columns of first gate stages and n rows of logic input lines,
each first gate stage having a pair of clock controlled driving MOS transistors connected in series with a first logic block made up of at least one MOS transistor which has its gate electrode corresponding to a logic input terminal for said first logic block connected to a respective one of said logic input lines, between first and second sources of reference potential, said first logic block having a logic output terminal connected to one of the MOS transistors therein,
a second gate stage matrix formed of p columns of second gate stages and m rows of logic input lines,
each second gate stage having a pair of clock controlled driving MOS transistors connected in series with a second logic block made up of at least one MOS transistor which has its gate electrode corresponding to a logic input terminal for said second logic block connected to a respective one of the logic input lines of said m rows of logic input lines, between said second and first sources of reference potential, said second logic block having a logic output terminal connected to one of the MOS transistors therein, the gate electrode of an MOS transistor of said second logic block being connected to the logic output terminal of a respective first logic block in said first gate stage matrix.
a third gate stage matrix formed of q columns of third gate stages and p rows of logic input lines,
each third gate stage having a pair of clock controlled driving MOS transistors connected in series with a third logic block made up of at least one MOS transistor which has its gate electrode corresponding to a logic input terminal for said third logic block connected to a respective one of the logic input lines of said p rows of logic input lines, between said first and second sources of reference potential, said third logic block having a logic output terminal connected to one of the MOS transistors therein, the gate electrode of an MOS transistor of said third logic block being connected to the logic output terminal of a respective second logic block in said second gate stage matrix,
a first clock line, connected to the clock controlled driving transistors in said first and third gate stage matrices, for supplying a first clock signal thereto, and
a second clock line, connected to the clock controlled driving transistors in said second gate stage matrix, for supplying a second clock signal, which is the inverse of said first clock signal, thereto, and
wherein
the conductivity type of the at least one MOS transistor making up said second logic block is opposite the conductivity type of the at least one MOS transistor making up said first and third logic blocks,
the driving MOS transistors and the first logic blocks in each first gate stage are arranged so that one of the driving MOS transistors therein is rendered conductive during first repeated intervals of said first clock signal for rendering the output potential of said first gate stage equal to said first reference potential irrespective of the state of said first logic block and the other of the driving MOS transistors therein conductive during second repeated intervals, alternating with said first repeating intervals of said first clock signal, for enabling the output potential of each first gate stage to change to a potential equal to the second reference potential depending on the state of said first logic block,
the driving MOS transistors and the second logic block in each second gate stage are arranged so that one of the driving MOS transistors therein is rendered conductive during said first repeated intervals for rendering the output potential of each second gate stage equal to said second reference potential, the output potential of each second gate stage being enabled to change to a potential equal to said first reference potential depending on the state of the second logic block thereof, and the driving MOS transistors and the third logic block in each third gate stage are arranged so that one of the driving MOS transistors therein is rendered conductive during said first repeated intervals for rendering the output potential of each third gate stage equal to said first reference potential, the output potential of each third gate stage being enabled to change to a potential equal to said second reference potential depending on the state of said third logic block.

2. The MOS logic circuit according to claim 1, wherein the driving MOS transistors of each respective stage have opposite conductivity types.

* * * * *